(12) United States Patent
Ito et al.

(10) Patent No.: US 9,647,258 B2
(45) Date of Patent: May 9, 2017

(54) METHOD FOR PRODUCING ELECTRODE COVERED WITH SODIUM METAL

(71) Applicant: NIPPON SODA CO., LTD., Tokyo (JP)

(72) Inventors: Hideaki Ito, Joetsu (JP); Hitoshi Kobayashi, Joetsu (JP); Toshiaki Yamashita, Myoto (JP); Shinichi Maruyama, Myoko (JP)

(73) Assignee: NIPPON SODA CO., LTD., Tokyo (JP)

( * ) Notice: Subject to any disclaimer, the term of this patent is extended or adjusted under 35 U.S.C. 154(b) by 0 days.

(21) Appl. No.: 14/347,213

(22) PCT Filed: Sep. 27, 2012

(86) PCT No.: PCT/JP2012/074882
§ 371 (c)(1),
(2) Date: Mar. 25, 2014

(87) PCT Pub. No.: WO2013/047657
PCT Pub. Date: Apr. 4, 2013

(65) Prior Publication Data
US 2014/0230688 A1   Aug. 21, 2014

(30) Foreign Application Priority Data
Sep. 29, 2011   (JP) .................. 2011-213624

(51) Int. Cl.
*H01M 4/04* (2006.01)
*H01M 4/134* (2010.01)
(Continued)

(52) U.S. Cl.
CPC ............. *H01M 4/0404* (2013.01); *C23C 2/02* (2013.01); *C23C 2/04* (2013.01); *C23C 14/16* (2013.01);
(Continued)

(58) Field of Classification Search
CPC .................................................. H01M 4/1395
See application file for complete search history.

(56) References Cited

U.S. PATENT DOCUMENTS 6,090,506 A * 7/2000 Inoue ................... C01G 19/006
429/137
6,645,675 B1 * 11/2003 Munshi ......................... 429/305
(Continued)

FOREIGN PATENT DOCUMENTS

JP        A-61-74641        4/1986
JP        A-2010-27538      2/2010
(Continued)

OTHER PUBLICATIONS

JP 2011009202 A trans.*
(Continued)

*Primary Examiner* — Sarah A Slifka
*Assistant Examiner* — Brian Ohara
(74) *Attorney, Agent, or Firm* — Oliff PLC (57) ABSTRACT

A current collector is covered with sodium metal through: (1) applying a sodium dispersion containing sodium metal and at least one substance selected from the group consisting of an imide salt and a binder, on a current collector in an inert gas environment (with an oxygen concentration of not more than 0.01% and a dew point of not more than −10° C.), followed by heating and drying; (2) pressure bonding a piece of solid sodium metal having a surface which exhibits a metallic luster onto a current collector in the aforementioned inert gas environment; (3) vapor-depositing sodium metal on a current collector in a reduced pressure environment; or (4) immersing a current collector having a surface fired at a temperature ranging from 150 to 300° C. in molten sodium (Continued)

metal after removing a coating film which is generated on a surface and formed from impurities, in the aforementioned inert gas environment.

7 Claims, 7 Drawing Sheets

(51) Int. Cl.
    *H01M 4/1395*     (2010.01)
    *C23C 2/02*     (2006.01)
    *C23C 2/04*     (2006.01)
    *C23C 14/16*     (2006.01)
    *C23C 24/10*     (2006.01)
    *C23C 26/00*     (2006.01)

(52) U.S. Cl.
    CPC ............ *C23C 24/106* (2013.01); *C23C 26/00* (2013.01); *H01M 4/043* (2013.01); *H01M 4/0423* (2013.01); *H01M 4/0435* (2013.01); *H01M 4/0471* (2013.01); *H01M 4/134* (2013.01); *H01M 4/1395* (2013.01); *Y02P 70/54* (2015.11)

(56) References Cited

U.S. PATENT DOCUMENTS

| | | | |
|---|---|---|---|
| 6,649,033 B2 | 11/2003 | Yagi et al. | |
| 2001/0032386 A1* | 10/2001 | Yamada et al. | 29/623.1 |
| 2002/0136948 A1* | 9/2002 | Missling et al. | 429/212 |
| 2010/0323232 A1* | 12/2010 | Kuze | H01M 2/1653 |
| | | | 429/144 |
| 2011/0117415 A1* | 5/2011 | Saka et al. | 429/144 |
| 2011/0183218 A1* | 7/2011 | Odani et al. | 429/338 |
| 2011/0189529 A1* | 8/2011 | Kuze | H01M 2/1653 |
| | | | 429/144 |

FOREIGN PATENT DOCUMENTS

| | | | |
|---|---|---|---|
| JP | 2010102917 A * | 5/2010 | |
| JP | A-2010-102917 | 5/2010 | |
| JP | A-2010-272492 | 12/2010 | |
| JP | 2011009202 A * | 1/2011 | |
| JP | A-2011-9202 | 1/2011 | |
| JP | A-2011-134550 | 7/2011 | |

OTHER PUBLICATIONS

Merriam-Webster, sodium.*
Merriam-Webster, dispersion.*
JP 20100102917 A trans.*
Merriam-Webster, disperse.*
Definitions from Google and Dictionary.com.*
Matsumoto et al., "Electrodeposition of Sodium and Lithium in Room Temperature Ionic Liquid: N-Methyl-N-Butylpyrrolidinium Trifluoromethyltrifluoroborate," Journal of Rare Earths, vol. 23, pp. 26-29, Oct. 2005.
Mar. 31, 2015 Office Action issued in Canadian Application No. 2,850,040.
May 11, 2015 Supplementary European Search Report issued in European Application No. 12836312.4.
International Search Report issued in International Patent Application No. PCT/JP2012/074882 mailed Dec. 4, 2012.

* cited by examiner

METHOD FOR PRODUCING ELECTRODE COVERED WITH SODIUM METAL

TECHNICAL FIELD

The present invention relates to a method for producing an electrode covered with sodium metal, and a sodium dispersion composition used in the aforementioned production method.

Priority is claimed on Japanese Patent Application No. 2011-213624, filed Sep. 29, 2011 the content of which is incorporated herein by reference.

BACKGROUND ART

Although the demand for lithium-ion batteries has been increasing in various fields such as mobile phones, automobiles, and storage batteries, because the ore source of lithium to become the negative electrode material thereof is ubiquitous worldwide, there is a growing concern about the global supply in recent years. On the other hand, sodium chloride which serves as a raw material of sodium is contained abundantly in seawater and bedded salt and is distributed globally. Accordingly, development of a sodium ion secondary battery using sodium in place of lithium has been desired.

Although sodium-sulfur (NaS) batteries have been put into practical use as the battery using sodium as a raw material, NaS batteries require a temperature of 1300° C. or higher to drive, and thus are limited to the specific applications of power storage and have not been put into practical use for general applications. In addition, although molten sodium is used as a negative electrode active material and negative electrodes are configured using a mesh made of SUS, steel wool, or the like as a current collector in the NaS batteries, because sodium metal is used in the form of liquid with high activity; there is a disadvantage in that sodium metal easily flows into the positive electrode chamber side to cause short circuit in those cases where the solid electrolyte breaks down.

In sodium secondary batteries, in order not to make sodium move to positive electrode side, it is required to adhere sodium to a current collector to prevent the break down of electrical connection therewith, thereby suppressing the flow of sodium. Accordingly, for example, those that are joined by adhering sodium metal or a sodium compound onto the surface of a current collector in layers so as to provide electrical conductivity have been used as the negative electrodes of sodium secondary batteries.

As a method of coating the surface of a support with sodium metal, for example, a method of producing a sodium metal-coated body has been known, which is characterized in that sodium metal is dissolved in liquid ammonia and the resulting solution is brought into contact with a support having good air permeability and a large surface area, followed by the volatilization of ammonia (for example, see Patent Document 1).

In addition, in the methods of producing sodium secondary batteries, a method of producing a negative electrode has been known, in which an appropriate amount of N-methyl pyrrolidone is added and mixed with a mixture prepared by mixing a negative electrode active material and polyvinylidene fluoride at a ratio of 95:5 to obtain a coating material-like slurry; a masking tape is adhered onto a part of copper foil with a thickness of 10 µm; the aforementioned slurry is coated onto the surface using a doctor blade, followed by drying to form a coating film; then, a similar coating film is formed on the opposite surface side, followed by application of a roll press, thereby preparing an electrode having a width of about 55 mm, length of about 330 mm, and thickness of about 230 µm to form a negative electrode; and the metallic sodium cut out into a width of 5 mm, length of 20 mm, and thickness of 200 µm is further pressure bonded onto one end of that negative electrode (for example, see Patent Document 2). As an improved method of this method for producing a negative electrode, a method has been known, in which a negative electrode is immersed in a solution prepared by dissolving sodium metal in liquid ammonia which is placed in a vessel cooled to about −40° C., before the negative electrode is pressure bonded with sodium metal, and is then taken out and charged into a vacuum chamber at room temperature to carry out the removal of ammonia, thereby producing a negative electrode predoped with sodium ions (for example, see Patent Document 3).

CITATION LIST

Patent Documents

[Patent Document 1] Japanese Unexamined Patent Application, First Publication No. Sho 61-074641
[Patent Document 2] Japanese Unexamined Patent Application, First Publication No. 2010-272492
[Patent Document 3] Japanese Unexamined Patent Application, First Publication No. 2011-009202

SUMMARY OF INVENTION

Technical Problem

It is difficult to handle sodium because sodium exhibits higher activity than lithium, is easily deactivated by the moisture in the air, and also reacts violently with water. In particular, sodium hardly forms an alloy with metals such as copper, and thus there is a problem in that it is difficult to adhere sodium on the surface of a current collector in those cases where metal foils such as copper foils are used as a current collector.

In addition, there was a problem of complicated operation with the methods described in Patent Documents 1 and 3 because of the use of liquid ammonia. Further, there is no description of specific method in Patent Document 2, and depending on the type of substrate, there was also a problem in that the obtained laminates were not necessarily satisfactory.

The present invention has an object of providing a method for producing an electrode covered with sodium metal in which sodium metal is deposited strongly and also in layers on the surface of a current collector; and a sodium dispersion composition used in the aforementioned production method.

Solution to Problem

A first mode of the present invention relates to a method for producing an electrode covered with sodium metal including any one of steps selected from the group consisting of the following steps (1) to (4):
(1) a step of applying a sodium dispersion containing sodium metal and at least one substance selected from the group consisting of an imide salt and a binder, on a current collector in an inert gas environment having an oxygen concentration of not more than 0.01% and a dew point of not more than −10° C., followed by heating and drying;

(2) a step of pressure bonding to piece of solid sodium metal having a surface which exhibits a metallic luster onto a current collector in an inert gas environment having an oxygen concentration of not more than 0.01% and a dew point of not more than −10° C.;
(3) a step of vapor-depositing sodium metal on a current collector in a reduced pressure environment; and
(4) a step of immersing a current collector having a surface fired at a temperature from 150 to 300° C. in molten sodium metal after removing a coating film which is generated on a surface and formed from impurities, in an inert gas environment having an oxygen concentration of not more than 0.01% and a dew point of not more than −10° C.

The aforementioned production method preferably includes the aforementioned step (1).

The electrode covered with sodium metal which is obtained by the aforementioned step (1) is preferably further subjected to a pressure molding process.

The aforementioned sodium dispersion used in the aforementioned step (1) preferably contains an imide salt and sodium metal.

The aforementioned imide salt is preferably at least one substance selected from the group consisting of a bisfluorosulfonylimide sodium salt and a bisfluorosulfonylimide potassium salt.

A second mode of the present invention relates to a sodium dispersion composition including sodium metal and an imide salt.

The aforementioned imide salt is preferably at least one substance selected from the group consisting of a bisfluorosulfonylimide sodium salt and a bisfluorosulfonylimide potassium salt.

Advantageous Effects of Invention

By using the present invention, it is possible to produce an electrode in which the surface of a current collector is covered uniformly and also firmly with sodium metal.

DESCRIPTION OF EMBODIMENTS

The inventors of the present invention have found that by suppressing the formation of oxides or the like on the surface of sodium metal, the adhesion of the sodium metal to the current collector improves. The present invention has been accomplished as a result of further investigation based on this finding.
<Production Method of an Electrode Covered with Sodium Metal>

A first mode of the present invention relates to a production method of an electrode in which the surface of a current collector is covered with sodium metal. In the production method of the present mode, by depositing sodium metal with no impurities such as oxides onto a current collector, the sodium metal can be deposited onto the current collector with unprecedentedly sufficient strength.

In the present invention and in the present description, an inert gas is a gas capable of suppressing the oxidation of sodium metal. Examples of the inert gas include nitrogen gas, helium gas, and argon gas.

The method for making the inside of the reaction system an inert gas atmosphere is not particularly limited, and examples thereof include a method of sufficiently purging the inside of the reaction system with an inert gas, and a method of repeating an operation several times in which the inside of the reaction system is degassed using a pump and then returned to normal pressure with an inert gas.

In the inert gas environment, the oxygen concentration is not more than 0.01%, and the dew point is not more than −10° C., and preferably not more than −40° C. On the other hand, the lower limit of the oxygen concentration is 0% and the lower limit of the dew point is, but not limited to, −70° C.

In the present invention, the current collector to be covered with sodium metal is not particularly limited, and is, for example, a foil, film, thin film, wire, fiber, plate, net, cloth, or porous material which is formed from copper, nickel, aluminum, titanium, stainless steel, carbons such as graphite and amorphous carbon, or a conductive rubber or resin, and which is subjected to no surface treatment or is subjected to a heat treatment. Among these, the aforementioned current collector is preferably a copper foil. The aforementioned copper foil is preferably an oxygen-free copper foil, more preferably a copper foil whose surface is heated and fired with a gas burner or the like, and even more preferably a copper foil which is surface-treated by being heated to a temperature equal to or higher than room temperature but not more than 300° C. with a butane burner or the like.

In those cases where solid sodium metal is used, it is possible to produce an electrode covered with sodium metal by a step of pressure bonding a piece of solid sodium metal whose surface exhibits a metallic luster onto a current collector in an inert gas environment with an oxygen concentration of not more than 0.01% and a dew point of not more than −10° C., and preferably not more than −40° C. The aforementioned piece of solid sodium metal having a surface with a metallic luster can be obtained by removing a coating film which is usually formed on the surface of solid sodium metal and formed from impurities, and more specifically, a coating film formed from peroxides, superoxides, oxides, hydroxides, or a mixture thereof (hereinafter, referred to as a coating film of oxides or the like) in the aforementioned inert gas environment. The piece of solid sodium metal prepared in this manner is immediately pressure bonded onto a current collector in the same inert gas environment.

In an inert gas environment with an oxygen concentration of not more than 0.01% and a dew point of not more than −10° C., the activity of sodium metal can be suppressed, and the formation of oxides or the like can be suppressed. For this reason, in this environment, it is possible to pressure bond a piece of solid sodium metal exhibiting a metallic luster onto the surface of a current collector before the coating film of oxides or the like is formed on the surface.

The method of pressure bonding a piece of solid sodium metal with a current collector is not particularly limited, and examples thereof include a method of rolling both of them with a roller and a method of pressing both of them with a pressing machine.

The pressure at the time of pressure bonding a piece of solid sodium metal and a current collector is not particularly limited as long as the force is at least sufficient enough to adhere the two, and, for example, it is possible to pressure bond the two by applying an external force which is at least sufficient enough to break the surface of the sodium particles, while the piece of solid sodium metal and the current collector are superposed.

In the case of using sodium vapor, it is possible to produce an electrode covered with sodium metal through a process in which sodium metal is vapor-deposited onto a current collector under a reduced pressure environment. The aforementioned reduced pressure environment is preferably one that is obtained by reducing the pressure in the aforementioned inert gas environment. Since the outside air is strictly blocked and the dew point is also lowered, in such a reduced pressure environment, an atmosphere is achieved in which degradation of the surface of solid sodium metal is suppressed. Under this atmosphere, it is possible to adhere sodium metal onto the current collector with no impurities involved by heating sodium metal and vapor-depositing the generated sodium vapor onto the current collector.

The method of depositing the sodium vapor onto a current collector is not particularly limited. For example, the sodium vapor may be deposited electrostatically onto a current collector, the sodium vapor may be sprayed and deposited onto a current collector, or the sodium vapor may be condensed and deposited onto a cooled current collector. It is preferable to vapor-deposit the sodium vapor onto a current collector which is heated to about 881° C. or less.

In the case of using molten (liquid) sodium metal, it is possible to produce an electrode covered with sodium metal through a process in which a current collector whose surface is fired at a temperature ranging from 150 to 300° C. with a burner or the like is immersed in a molten sodium metal immediately after the coating film of oxides or the like which is present on the liquid surface is removed therefrom, in an inert gas environment with an oxygen concentration of not more than 0.01% and a dew point of not more than $-10°$ C., and preferably not more than $-40°$ C. By removing a coating film of oxides or the like from the molten sodium metal in advance, it is possible to adhere sodium metal containing no impurities such as oxides onto the current collector.

As a current collector to be immersed in molten sodium metal, those having a surface with no dirt or the like attached thereon are used, and more specifically, a current collector fired from 150 to 300° C. with a gas burner or the like is used. This current collector is immersed in molten sodium metal and then pulled out to solidity as it is, thereby forming a thin layer of sodium metal on the surface of the current collector.

By applying a sodium dispersion containing sodium metal and at least one substance selected from the group consisting of an imide salt and a binder onto a current collector in the aforementioned inert gas environment (with an oxygen concentration of not more than 0.01% and a dew point of not more than $-10°$ C., and preferably not more than $-40°$ C.) and subjecting the resultant to heating and drying (preferably heating and drying under reduced pressure), it is possible to produce an electrode covered with sodium metal. The aforementioned sodium dispersion is in the form of, for example, an emulsion or suspension in which the sodium metal particles are dispersed (uniformly suspended) or in the form of a precipitating dispersion.

The aforementioned sodium dispersion preferably contains no impurities such as oxides. For this reason, as the aforementioned sodium metal, a piece of metal which is cut out from solid sodium metal in the aforementioned inert gas environment, and in which the entire surface exhibits a metallic luster, or molten sodium metal is preferably used.

As the aforementioned imide salt, it is preferable to use at least one substance selected from the group consisting of a bisfluorosulfonylimide sodium salt and a bisfluorosulfonylimide potassium salt.

When the aforementioned sodium dispersion contains an imide salt, since the surface of the sodium metal particles is coated with the imide salt, the formation of oxides or the like on the surface of the sodium metal particles is further suppressed, which is preferred.

As a binder, for example, those can be used which are selected appropriately from amongst the binders used together with an electrode active material, when preparing the electrodes of sodium secondary batteries or lithium secondary batteries.

More specifically, examples of the binders include (meth) acrylic acid-based resins, (meth)acrylamide-based resins, styrene-based resins, polybutadiene resins, epoxy resins, vinyl resins, polyvinyl alcohols, phenol resins, melamine resins, polyurethane resins, urea resins, polyamide resins, polyimide resins, and polyamideimide resins. Other than those, polysaccharides or the derivatives thereof such as starch, methylcellulose, carboxymethylcellulose hydroxymethylcellulose, and nitrocellulose may be used. Further, the binder may be a polymer of a fluorine compound or may be a polymer formed from monomers containing no fluorine atom. Examples of the polymers of fluorine compounds include polyvinylidene fluoride. In addition, one type of binder may be used alone, or two or more types thereof may be used as a mixture. As the binder used in the present invention, (meth)acrylic acid-based resins, (meth)acrylamide-based resins, styrene-based resins, epoxy resins, vinyl resins, and polyvinyl alcohols are preferred, and (meth) acrylic acid-based resins such as sodium polyacrylate or styrene-butadiene-based resins are more preferred.

A conductive agent can also be mixed if necessary, and specific examples thereof include conductive materials such as Ketjen black, carbon black, acetylene black, natural graphite, artificial graphite, carbon fibers, metal powders, metal fibers, and conductive ceramic materials. In the present invention, only one type of conductive agent may be used, or a mixture of two or more types thereof may be used. As the conductive agent used in the present invention, it is preferable to use one type of Ketjen black, carbon black, and acetylene black, or a mixture of two or more types thereof.

The aforementioned sodium dispersion is prepared by adding and mixing sodium metal and at least one substance selected from the group consisting of an imide salt and a binder in an appropriate dispersion medium. The sodium metal, and the imide salt and/or binder may be added directly for preparation in one dispersion medium; each of a dispersion containing sodium metal and a solution containing an imide salt and/or a binder may be independently prepared, followed by mixing of the two for preparation; or each of a dispersion containing sodium metal and an imide salt and a solution containing a binder may be independently prepared, followed by mixing of the two for preparation. Here, in the case of preparing the aforementioned dispersion containing sodium metal, it is preferable either to load the aforementioned piece of solid sodium metal having a surface with a metallic luster in a dispersion medium, followed by mixing and stirring while heating to a temperature equal to or higher than the melting point of sodium (97.8° C.), or to add molten sodium metal to a dispersion medium followed by mixing and stirring. In addition, in the case of preparing a dispersion containing an imide salt, it is preferable to carry out the mixing and stirring while heating to a temperature equal to or higher than the melting point of the imide salt. Further, in the case of preparing a dispersion containing sodium metal and an imide salt, it is preferable to carry out the mixing and stirring while heating to a temperature which is equal to or higher than the melting point of sodium and is also equal to or higher than the melting point of the imide salt. By preparing a sodium dispersion in this manner, the sodium metal particles in which the formation of oxides or the like is suppressed can be dispersed more uniformly within a dispersion medium, and a more uniform coating film of sodium metal can be formed on a current collector.

The aforementioned mixing method is not particularly limited, and can be performed by using a generally used dispersing machine such as a homogenizer, a ball mill, a sand mill, and a planetary mixer.

Before mixing with sodium metal, it is preferable to remove contaminants and impurities such as water which react with sodium metal from the dispersion medium, imide salt and binder in advance. As a removal method, specific examples include a method in which, in the case of preparing a solution containing an imide salt and/or a binder followed by mixing with a dispersion containing sodium metal, a small amount of sodium metal, other than the sodium metal to be adhered onto a current collector, is added in advance to the solution containing an imide salt and/or a binder, thereby carrying out a dehydration reaction or the like in advance.

The dispersion medium for dispersing sodium metal or the like is not particularly limited as long as it is a solvent which does not react with sodium metal. As the solvent, for example, hydrocarbon-based solvents are preferred, and specific examples thereof include fluid, paraffin-based hydrocarbons having 6 to 20 carbon atoms and aromatic hydrocarbons such as toluene and xylene. The paraffin-based hydrocarbon may be a linear normal paraffin or an isoparaffin having a branched chain, and a normal paraffin is more preferred. The dispersion medium may be composed solely of one type or a mixture of two or more types thereof may be used.

The content of each of the components in the sodium dispersion containing sodium metal and an imide salt and/or a binder is not particularly limited as long as the amount is sufficient so that when this sodium dispersion is applied onto the surface of the current collector, eventually, an electrode covered with sodium metal is obtained. For example, in this sodium dispersion, the content of sodium metal is preferably not more than 30% by mass and not less than 0.5% by mass, and more preferably not more than 10% by mass and not less than 1% by mass. In addition, in this sodium dispersion, the content of the binder is preferably not more than 10% by mass, and more preferably ranges from 3 to 5% by mass, relative to 100% by mass of the sodium metal content. Further in this sodium dispersion, the content of the imide salt is preferably not more than 5% by mass, and more preferably from 0.5 to 2% by mass, relative to 100% by mass of the sodium metal content.

The aforementioned sodium dispersion is applied onto a current collector in an inert gas environment with an oxygen concentration of not more than 0.01% and a dew point of not more than −10° C., and preferably not greater than −40° C.

The method for applying the aforementioned sodium dispersion onto the current collector surface is not particularly limited, and examples thereof include a spin coating method, a bar coating method, a doctor blade method, a dipping method, and a direct rolling method.

Thereafter, the current collector onto which the aforementioned sodium dispersion is applied is heated and dried in an inert gas environment with the same low oxygen concentration and the same low dew point as those described above. Here, this heating and drying treatment is preferably carried out under a reduced pressure environment, because the outside air is strictly blocked and the dew point is lowered, and thereby, the formation of impurities such as oxides can be further suppressed. Due to this heating and drying treatment, the dispersion medium on the current collector is removed through evaporation, and the fine particles of sodium metal or the fine particles of sodium metal of which the surface is coated with a molten salt (ionic liquid) of the imide salt are deposited onto the current collector surface together with the binder. It should be noted that in order to remove the organic solvent more completely from the current collector surface, it is preferable to wash the current collector after being heated and dried, with a volatile solvent which the organic solvent used as a dispersion medium can dissolve, followed by drying.

The thus obtained electrode covered with sodium metal can be used as it is, but is preferably further subjected to a pressure molding process thereafter. For example, by applying pressure using a pressing machine or the like to an electrode covered with sodium metal which is formed by applying a sodium dispersion onto the surface of a current collector, followed by drying, it is possible to further strengthen the joint between the coating film formed from sodium dispersion and the current collector. Moreover, it is possible to break down the surface coating film of fine particles of sodium metal which are adhered onto the current collector surface by pressurization, and to thereby expose a non-degraded, active surface, which is intrinsic to sodium metal. For example, when pressure is applied through, for instance, the rolling process using a roll press, gaps such as cracks are generated in the coating film of sodium metal. By using an electrode having cracks in the coating film of sodium metal, it is possible to form a sodium coating film with a higher sodium activity and a larger effective surface area.

<Sodium Dispersion Composition Containing Sodium Metal and Imide Salt>

A second mode of the present invention relates to a sodium dispersion composition containing sodium metal and an imide salt. The sodium dispersion composition of the present mode is used for enhancing the adhesion of sodium metal to the current collector, and is used in the aforementioned production method according to the first mode.

The aforementioned sodium dispersion composition is in the form of, for example, an emulsion or suspension in which the sodium metal particles are dispersed (uniformly suspended) or in the form of a precipitating dispersion.

The aforementioned sodium metal is prepared by using those described in the aforementioned first mode, and preferably a piece of solid sodium metal with a surface exhibiting a metallic luster which is obtained by cutting off a coating film of oxides or the like from the surface of the piece of solid sodium metal in the aforementioned inert gas environment, or molten sodium metal.

As the aforementioned imide salt, at least one substance selected from the group consisting of a bisfluorosulfonylimide sodium salt and a bisfluorosulfonylimide potassium salt is preferably used.

The sodium dispersion composition according to the second mode of the present invention can, as in the first mode described above, contain a binder, a conductive agent, and/or a dispersion medium or the like, and it is preferable to at least contain a binder and a dispersion medium. For the aforementioned binder, conductive agent and dispersion medium, those described in the aforementioned first mode can be used.

The sodium dispersion composition according to the second mode of the present invention is prepared by mixing sodium metal and an imide salt in the same method as in the aforementioned first mode. The aforementioned sodium dispersion composition is preferably prepared by adding, in one dispersion medium in the inert gas environment described above, the aforementioned piece of solid sodium metal with a surface exhibiting a metallic luster or molten sodium metal and an imide salt, followed by mixing and stirring. More preferably, the aforementioned sodium dispersion composition is prepared by charging the aforementioned piece of solid sodium metal with a surface exhibiting a metallic luster and an imide salt in a dispersion medium, followed by mixing and stirring while heating to a temperature which is equal to or higher than the melting point of sodium (97.8° C.) and is also equal to or higher than the melting point of the imide salt. Because the surface of the sodium metal particles can be coated with an imide salt more efficiently when prepared in this manner, there is a tendency that the formation of oxides or the like on the surface of the sodium metal particles is further suppressed, and that the uniform adhesion of sodium metal to the current collector is further enhanced.

As in the first mode described above, with respect to the constituents of the sodium dispersion composition other than the sodium metal, such as the dispersion medium and the imide salt described above, it is preferable to remove the contaminants and impurities such as water which react with sodium metal in advance, before mixing with sodium metal.

The content of sodium metal in the sodium dispersion composition according to the second mode of the present invention is not particularly limited, but is preferably not more than 30% by mass and not less than 0.5% by mass and more preferably not more than 10% by mass and not less than 1% by mass. In addition, the content of the imide salt in the sodium dispersion composition according to the second mode of the present invention is preferably not more than 5% by mass, and more preferably ranges from 0.5 to 2% by mass, relative to 100% by mass of the sodium metal content.

EXAMPLES

Hereinafter, the present invention is described in detail, based on as series of examples. It should be understood that the scope of the present invention is in no way limited by the following examples.

[Example 1] Preparation of Laminate Using Solid Sodium Metal

Figure 1:
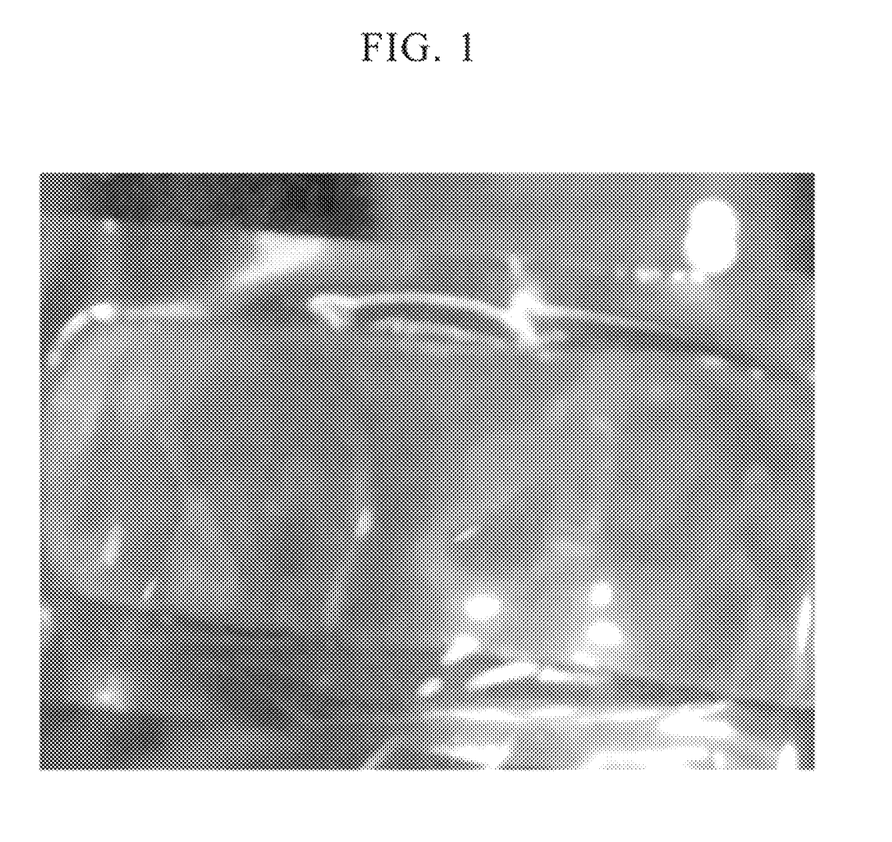
FIG. 1 is an image of a laminate obtained in Example 1.

First, a solid sodium metal obtained by collecting the molten sodium metal following the solidification in a mold was transferred into a glove box under a 4N grade nitrogen atmosphere with a dew point of not more than −10° C. and an oxygen concentration of not more than 0.01%. The surface of the solid sodium metal was removed with a knife in this glove box, and by using a roller, a piece of sodium metal in a state of maintaining a metallic luster was immediately rolled, pressure bonded, and joined to a copper foil which had not been subjected to a surface treatment (oxygen-free copper was used, and the same applies hereinafter), thereby producing a sodium metal laminate. The thus obtained sodium metal laminate is shown in FIG. 1. Sodium was deposited on the produced sodium metal laminate with sufficient strength and did not detach therefrom.

Comparative Example 1

Figure 2:
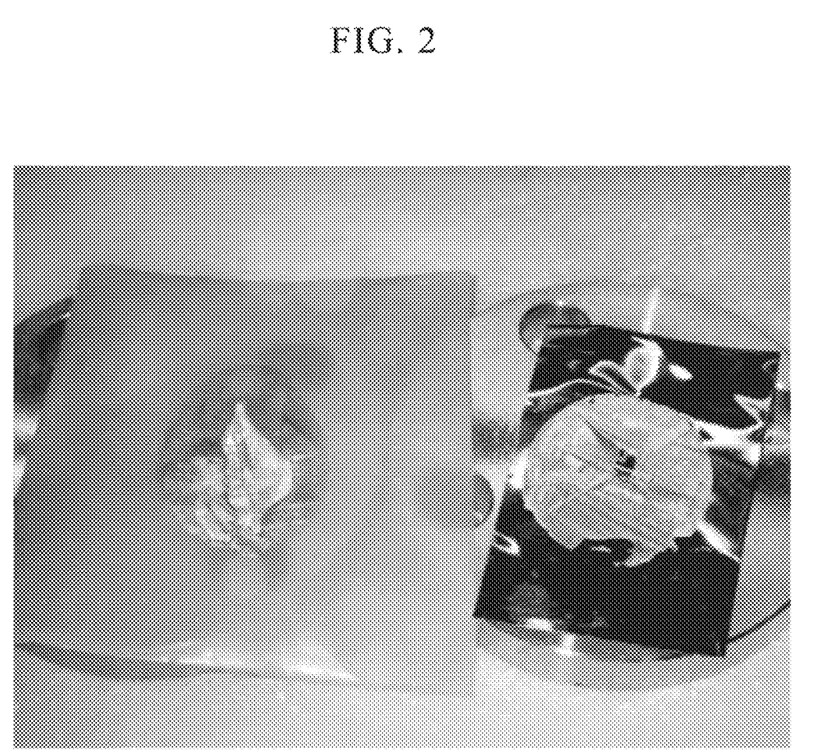
FIG. 2 is an image of a laminate obtained in Comparative Example 1.

A sodium metal laminate was prepared in the same manner as in Example 1 with the exception that the surface of the sodium metal was not removed in the glove box. As shown in FIG. 2, the sodium metal in which the surface was removed did not adhere to the copper foil and detached therefrom.

[Example 2] Preparation of Laminate Using Molten Sodium Metal

Figure 3:
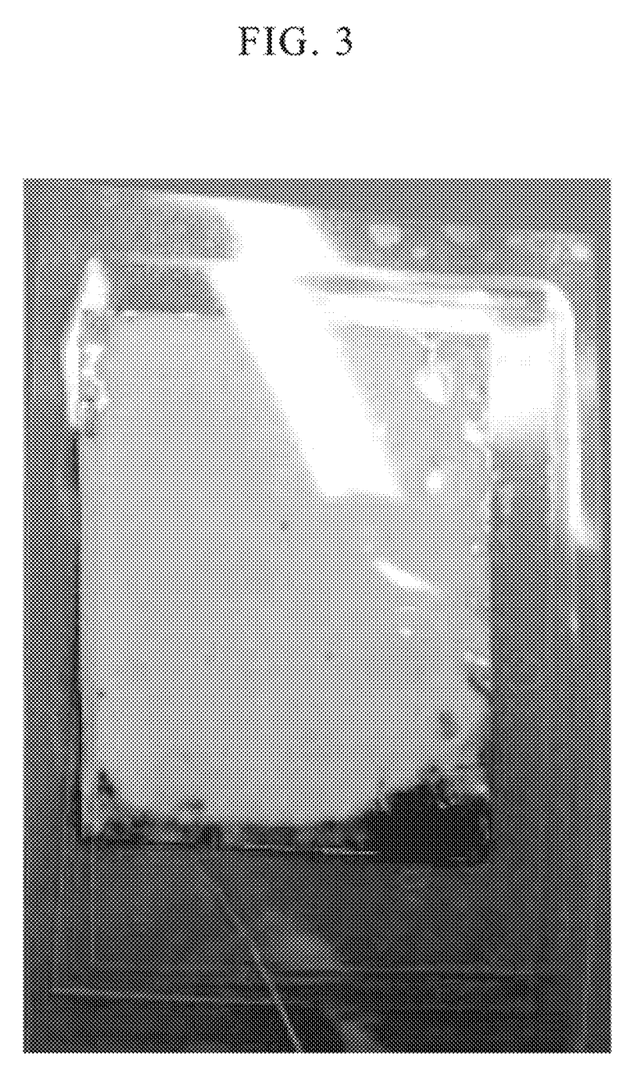
FIG. 3 is an image of a laminate obtained in Example 2.

After heating a stainless steel container charged with solid sodium metal using a heating device to melt the sodium metal in a glove box under the same conditions as in Example 1, the coating film of oxides or the like which was generated on the surface was removed from the obtained molten sodium metal. A copper film prepared by firing the surface at 150° C. using a burner was immersed in a molten sodium metal which exhibited a metallic luster immediately after the removal of the surface coating film, and was then immediately pulled out. The sodium metal deposited onto the copper foil was solidified as it is, thereby producing a sodium metal laminate with a smooth surface. The thus obtained sodium metal laminate is shown in FIG. 3. Sodium was deposited on the produced sodium metal laminate with sufficient strength and did not detach therefrom.

Comparative Example 2

A sodium metal laminate was prepared in the same manner as in Example 2 with the exception that molten sodium metal in which the liquid surface was covered with oxides or the like was used. As a result, sodium deposited onto the copper foil was in an uneven manner and sodium did not deposit uniformly.

Comparative Example 3

Figure 4:
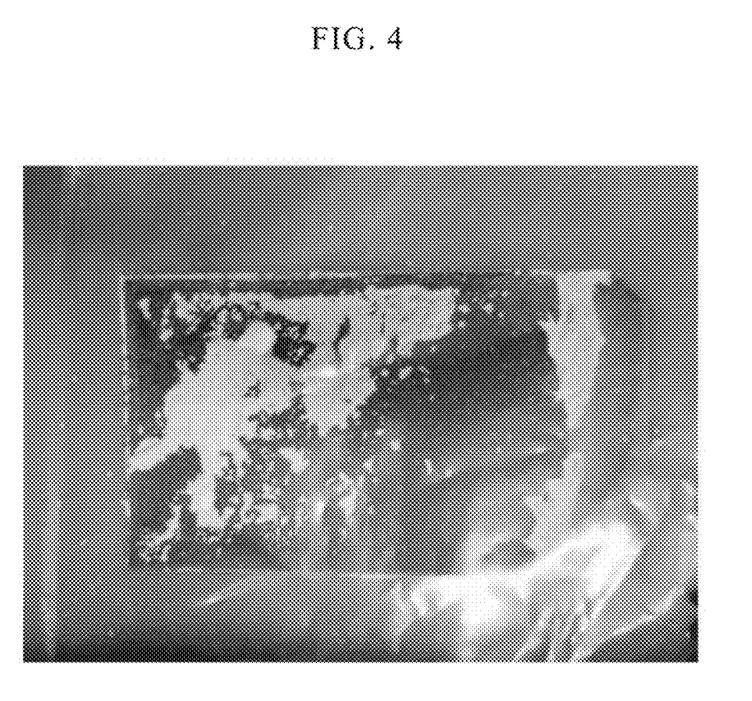
FIG. 4 is an image of a laminate obtained in Comparative Example 3.

A sodium metal laminate was prepared in the same manner as in Example 2 with the exception that a copper foil with no firing treatment conducted on the surface and with contaminants deposited thereon was used. As a result, the wettability of the copper foil and liquid sodium was deteriorated, and as shown in FIG. 4, sodium did not deposit uniformly onto the copper foil.

[Example 3] Preparation of Laminate Using Sodium Metal Vapor

Figure 5:
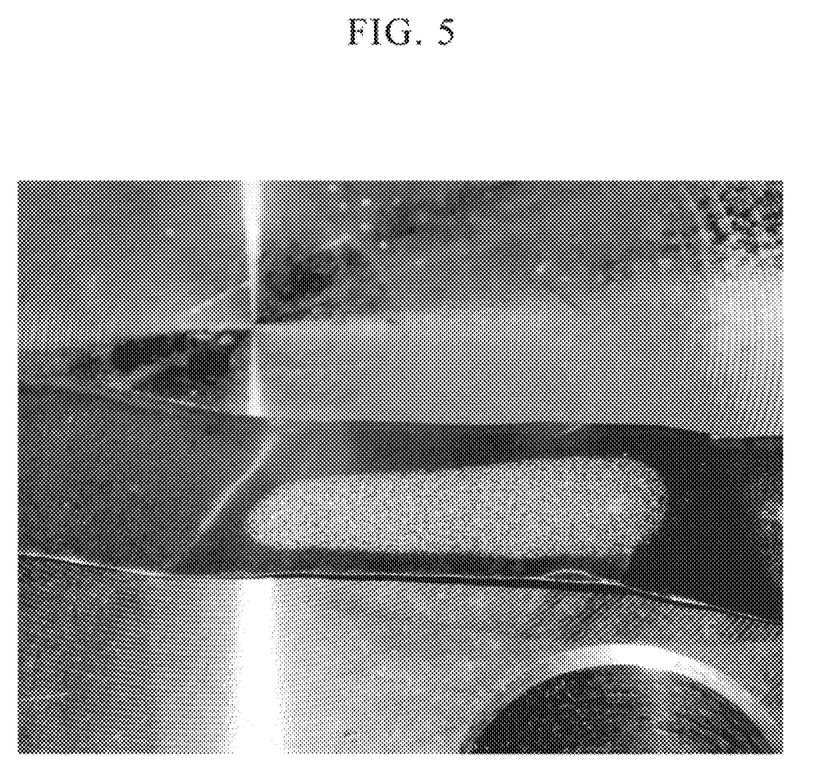
FIG. 5 is an image of a laminate obtained in Example 3.

After placing sodium metal and a copper foil each in a vacuum pressure vessel which could be heated separately in a glove box under the same conditions as in Example 1, the lid was placed thereon, and heating was carried out while reducing the pressure. Sodium metal was vapor-deposited onto the copper foil in this container, thereby obtaining a sodium metal laminate. The thus obtained sodium metal laminate is shown in FIG. 5. In the produced sodium metal laminate, sodium did not detach and was deposited uniformly.

[Example 4] Preparation of Laminate Using Sodium Dispersion

Figure 6:
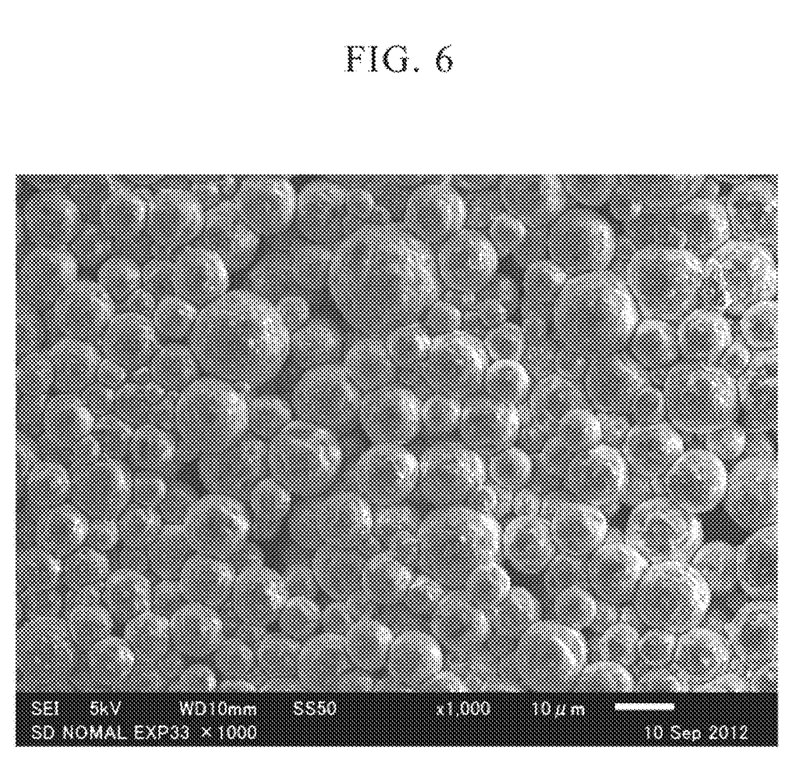
FIG. 6 is an electron microscope image of sodium particles which are bonded onto a copper foil in Example 4 (magnification: 1,000-fold).

A piece of sodium metal with a surface exhibiting a metallic luster was obtained by cutting from solid sodium metal in a glove box under the same conditions as in Example 1, and the thus obtained piece of sodium metal was placed in a four-necked flask with normal paraffin so that the content of sodium metal was 10% by mass. This mixture of normal paraffin and sodium metal was heated to a temperature equal to or higher than the melting point of sodium while stirring with a homogenizer to disperse sodium, and was then cooled to room temperature, thereby obtaining a gray colored sodium dispersion (hereinafter, referred to as a dispersion A). Separate from this, a combined preparation containing a binder was prepared by dispersing, mixing and stirring, at a ratio of, 9 g of a styrene-butadiene-based resin, 90 g of normal paraffin and 1 g of Ketjen black. 10 g of the aforementioned dispersion A and 3 g of the combined preparation containing a binder was sufficiently stirred and applied onto a copper foil, and then normal paraffin was removed by heating and drying under reduced pressure, to thereby obtain a sodium laminate in which a uniform sodium dispersion was bonded to the copper foil, as shown in FIG. 6.

Figure 7:
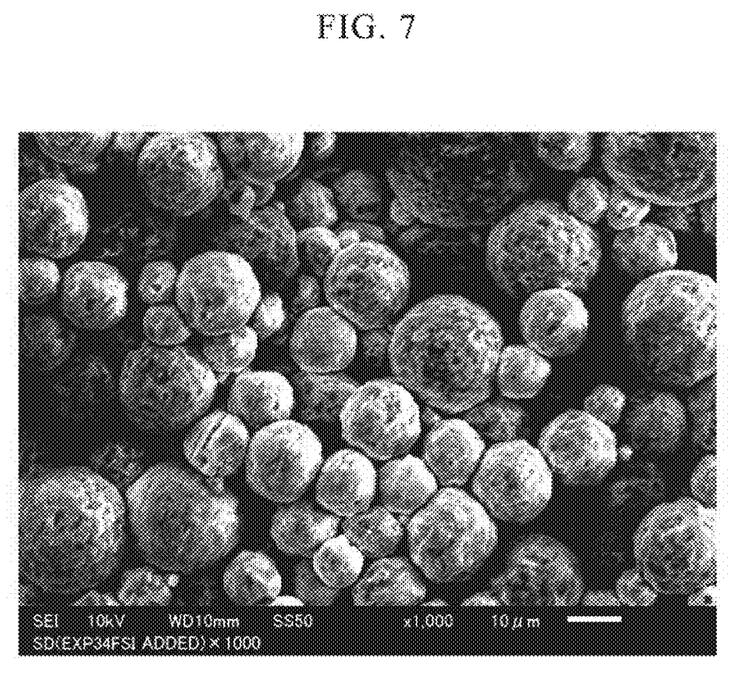
FIG. 7 is an electron microscope image of sodium particles which are bonded onto a copper foil in Example 5 (magnification: 1,000-fold).

[Example 5] Preparation of Laminate Using Sodium Dispersion Composition 8 g of sodium, 0.4 g of an equimolar mixture of a bisfluorosulfonylimide sodium salt and a bisfluorosulfonylimide potassium salt, and 72 g of normal paraffin were placed in a four-necked flask under the same conditions as in Example 4, and they were then heated to a temperature which was equal to or higher than the melting point of sodium and was also equal to or higher than the melting point of the imide salt, and stirred and dispersed collectively, thereby obtaining a dispersion with a black surface (hereinafter referred to as a dispersion B). A sodium dispersion composition prepared by mixing 0.3 g of the combined preparation containing a binder which was described in Example 4 and 1 g of the aforementioned dispersion B was applied onto a copper foil and heated and dried under reduced pressure, thereby forming a coating film formed from the sodium particles which were uniformly bonded to the surface of the copper foil, as shown in FIG. 7. The sodium laminate obtained in this manner had a large effective surface area while maintaining the activity of sodium.

Example 6

The sodium laminate prepared in Example 5 was rolled with a pressing machine. As a result, a sodium laminate in which cracks were present on the surface of the sodium particles was obtained.

INDUSTRIAL APPLICABILITY

According to the present invention, it is possible to produce an electrode in which the periphery of the current collector is covered uniformly and also firmly with sodium metal, by use of the present invention.

The invention claimed is:

1. A production method for producing a negative electrode for use in a sodium secondary battery in which a surface of a current collector is covered with sodium metal comprising:
    a step of applying a sodium dispersion containing sodium metal and at least one substance selected from the group consisting of an imide salt and a binder, on a current collector in an inert gas environment having an oxygen concentration of not more than 0.01% and a dew point of not more than −10° C., followed by heating and drying,
    wherein the binder comprises at least one resin selected from the group consisting of styrene-based resins, polybutadiene resins, and vinyl resins.

2. The production method according to claim 1, further comprising a pressure molding step.

3. The production method according to claim 1, wherein said sodium dispersion comprises said imide salt and sodium metal.

4. The production method according to claim 3, wherein said imide salt is at least one substance selected from the group consisting of a bisfluorosulfonylimide sodium salt and a bisfluorosulfonylimide potassium salt.

5. The production method according to claim 2, wherein said sodium dispersion comprises said imide salt and sodium metal.

6. The production method according to claim 5, wherein said imide salt is at least one substance selected from the group consisting of a bisfluorosulfonylimide sodium salt and a bisfluorosulfonylimide potassium salt.

7. A production method for producing a negative electrode for use in a sodium secondary battery in which a surface of a current collector is covered with sodium metal comprising:
    a step of applying a sodium dispersion containing sodium metal and an imide salt, on a current collector in an inert gas environment having an oxygen concentration of not more than 0.01% and a dew point of not more than −10° C., followed by heating and drying.

* * * * *